United States Patent [19]

Okatani et al.

[11] 4,205,270

[45] May 27, 1980

[54] STATION SELECTION INDICATING DEVICE

[75] Inventors: Masanao Okatani; Hiroshi Onishi; Yoshiaki Ishibashi; Reisuke Sato; Hisashi Suganuma; Tomohisa Yokogawa; Yoshiharu Ueki; Haruo Kama; Tadashi Kosuga, all of Kawagoe; Tadashi Ogawa, Tokorozawa, all of Japan

[73] Assignee: Pioneer Electronic Corporation, Tokyo, Japan

[21] Appl. No.: 921,154

[22] Filed: Jun. 30, 1978

[30] Foreign Application Priority Data

Jun. 30, 1977 [JP] Japan .................................. 52-78081

[51] Int. Cl.² ............................................. H04B 1/16
[52] U.S. Cl. ................................... 455/158; 455/180; 455/186

[58] Field of Search ................ 325/453, 455, 457, 458, 325/459, 464, 465, 470; 358/191, 192

[56] References Cited

U.S. PATENT DOCUMENTS

| | | | |
|---|---|---|---|
| 3,651,469 | 3/1972 | Keese | 325/470 |
| 3,924,191 | 12/1975 | Collins et al. | 325/464 |
| 3,961,261 | 6/1976 | Pflasterer | 325/459 |
| 3,968,440 | 7/1976 | Ehni | 325/455 |
| 4,041,402 | 8/1977 | Mogi | 325/465 |
| 4,085,372 | 4/1978 | Mogi et al. | 325/464 |

*Primary Examiner*—Robert L. Griffin
*Assistant Examiner*—Jin F. Ng
*Attorney, Agent, or Firm*—Sughrue, Rothwell, Mion, Zinn and Macpeak

[57] ABSTRACT

During preset station selection operation in a digital receiver the station selection switch most recently operated is indicated by a light so as to prevent erroneous operation at the same switch again.

3 Claims, 1 Drawing Figure

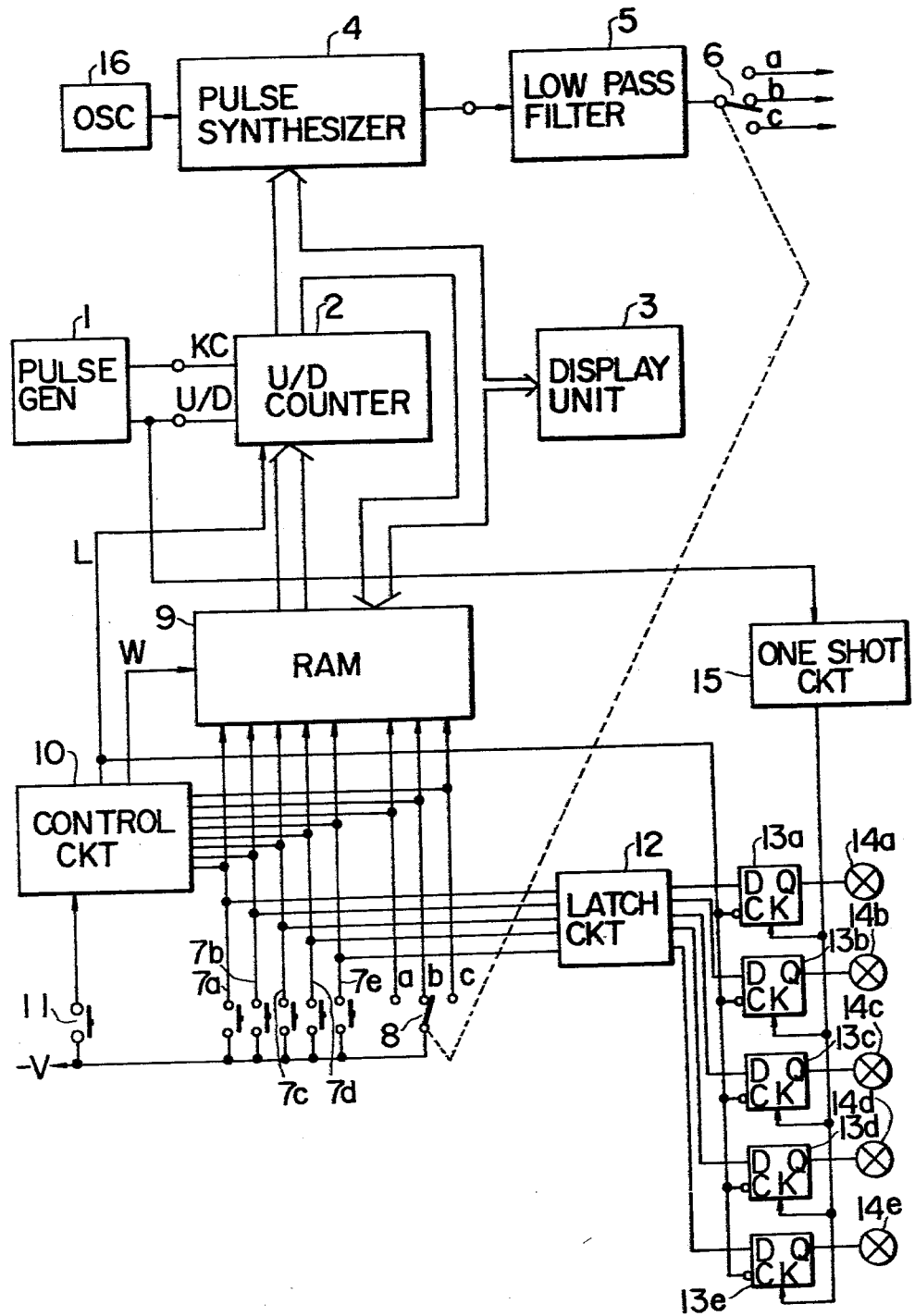

STATION SELECTION INDICATING DEVICE

BACKGROUND OF THE INVENTION

This invention relates to a multiband radio receiver in which a preset station selection operation is carried out with non-lock type channel selecting switches, and more particularly to a station selection indicating device in such a receiver in which the channel selecting switch effecting a preset station selection operation is displayed or indicated.

Recently, due to the rapid progress of electronic engineering, a variety of radio receivers has been proposed. For example, a digitally controlled preset radio receiver was disclosed in applicant's Japanese Utility Model Application No. 11353/1975. In the above conventional radio receiver, the channel preset system comprises a preset switch; a channel selecting switch; a pulse generator for selectively generating up pulses and down pulses; an UP/DOWN counter connected to the pulse generator; a digital display means for displaying a frequency value in response to the digital output signal of the U/D counter; a digital-to-analog convertor connected to the U/D counter to convert the digital output signal thereof into an analog signal, the analog signal being applied to varactor diodes in a tuning circuit; a memory means such as a random access memory (RAM) for memorizing the output of the U/D counter and providing outputs as to the data addressed therein to the U/D counter; and a control circuit for controlling write and read-out operation of the RAM.

In this case, however, the multiband radio receiver as described above is disadvantageous in the following respect. Since non-lock type channel selecting switches are employed, it cannot be determined at what channel the station being received is preset. Accordingly, when it is required to change the preset signal reception, sometimes the channel selecting switch by which the station being received has been preset may be erroneously operated again.

SUMMARY OF THE INVENTION

Accordingly, an object of the present invention is to provide a station selection indicating device in which an indicating element indicates a channel selecting switch to which a station being received is preset. Briefly, this is accomplished by providing a latch circuit for receiving and storing the output signal from the most recently operated channel selection switch and providing a data input to a corresponding flip-flop. The Q output of each flip-flop energizes an indicating light adjacent that channel selection switch when the flip-flop is clocked by the load signal to the U/D counter from the control circuit during a preset station selection operation.

BRIEF DESCRIPTION OF THE DRAWING

In the accompanying drawing, the single FIGURE is a block diagram illustrating one example of the station selection indicating device in an electronic preset tuning system, according to the present invention.

DESCRIPTION OF THE PREFERRED EMBODIMENTS

A station selection indicating device in a multiband radio receiver according to the present invention will be described with reference to the accompanying drawing.

In FIG. 1 which is a block diagram showing essential components of an electronic preset tuning system according to the present invention, a pulse generator 1 has a pair of output terminals from which a series of either up pulses U or down pulses D and clock pulses KC are selectively generated by manual operation. The output terminals of the pulse generator 1 are connected to a binary UP/DOWN counter 2 which employs the up-/down pulses U/D outputted from the pulse generator 1 as a count control signal to count the clock pulse KC applied thereto. An output of the U/D counter 2 is fed to a digital frequency display unit 3. The display unit 3 employs a few most significant bits of the count output of the U/D counter 2 as its input to carry out digital display of the selected frequency. The output of the U/D counter 2 is also fed to an input of a pulse synthesizer 4 in which pulse signals obtained by subjecting an oscillation signal to successive frequency divisions are selected and synthesized with the aid of the output signal of the U/D counter 2, to thereby obtain a serial pulse train having the number of pulses which corresponds to the output of the U/D counter 2. Such a pulse synthesizer is described in U.S. Pat. No. 3,603,977. An output of the pulse synthesizer 4 is fed to a low pass filter which constitutes a digital-to-analog (D-A) convertor together with the pulse synthesizer 4 and an oscillator 16. A band selecting switch 6 operates to selectively supply the D.C. output of the low pass filter 5 to a tuning circuit (not shown) to thereby select a desired band, and has stationary contacts a through c corresponding to bands A through C, which operates in association with the aforementioned band selecting switch 6. A channel selecting switch 7 comprises a plurality of non-lock type switches 7a through 7e and one side of the channel switches 7 are commonly connected. A random access read-write memory (RAM) 9 has a plurality of inputs connected to the output sides of the channel selecting switches 7a through 7e and the stationary contacts a through c of the band selecting switch 8, respectively, in order to memorize the output of the U/D counter 2 at an address assigned by the indications of the channel selecting switches 7a through 7e and the band selecting switches 8, or to read-out the data memorized at an assigned address to supply it to the U/D counter 2. A control circuit 10 has an input connected to a one side of a preset switch 11 the other side of which is connected to a common connection line of the channel selecting switches 7a through 7e and the band selecting switch 8. The control circuit 10 also has inputs connected to respective output sides of the channel selecting switches 7a through 7e and the band selecting switch 8. When the preset switch 11 is in an "off" state and any one output from the channel selecting switches 7a through 7e and any one output from the band selecting switch 8 are provided, the control circuit 10 supplies a load signal L to the U/D counter 2. On the contrary, in the case when the preset switch 11 is in an "on" state, it supplies a write signal W to the random access read-write memory 9. A latch circuit 12 which has inputs connected to respective output sides of the channel selecting switches 7a through 7e, holds only the output of the channel selecting switch which has been most recently operated. Flip-flop circuits 13a through 13e such as D-type flip-flop circuits are connected to outputs of the latch circuit 12 in correspondence to the channel selecting switches 7a through 7e, respectively. In these flip-flop circuits 13a through 13e, the load signal L ("L") outputted by the control circuit 10 is employed as a clock input CK. Display elements 14a through 14e are let by the outputs Q of the respective flip-flop circuits 13a through 13e. Display elements 14a through 14e can of course be placed anywhere along the enclosure (not shown) which houses the receiver, but it has been found that one very satisfactory arrangement is to make the display elements 14a through 14e integral with their associated channel selecting switches 7a through 7e, so that when a channel selecting switch is selected by the user, a visual indication is provided on the selected switch element. Switches having integral display elements are well known in the art, and are commercially available from many sources. A one shot circuit 15 operates to be triggered by the rise of the up/down pulse outputted by the pulse generator 1 to provide a reset pulse having a narrow pulse width, thereby resetting the respective flip-flop circuits 13a through 13e.

In the thus organized radio receiver with the electronic preset tuning system, if the pulse generator 1 is operated, that is, if the knob of the pulse generator 1 is rotated to generate an up pulse U, for instance, and a clock pulse, the up pulse U and the clock pulse KC are supplied to the U/D counter 2, and accordingly this causes the U/D counter 2 to up-count the clock pulse KC successively. The parallel count outputs of the U/D counter 2 are applied to the pulse synthesizer 4, where the singals obtained by subjecting the oscillation signal produced by the oscillator 16 to successive frequency divisions, are selectively combined with the corresponding output of the U/D counter 2 into a serial pulse train having a number of pulses corresponding to that of the output of the U/D counter 2 in the manner described above. The thus obtained output of the synthesizer 4 is fed to a low pass filter 5 to remove a high frequency component as a result of which a D.C. voltage signal corresponding to the output of the U/D counter 2 can be obtained. This D.C. voltage signal is applied to a varactor diode included in a tuning circuit (not shown) which is selected by an operation of the band selecting switch 6 so that the corresponding frequency tuning in that band is carried out. On the other hand, the most significant bits of the output of the U/D counter 2 are applied to the digital frequency display unit 3, where the frequency being received is digitally displayed. Disclosed above is the electronic tuning operation in the case where a station is manually selected.

In preset operation, under an assumption that a desired channel in a desired band has been selected in that manual manner described above, the preset switch 11 is turned-on, and then one of the channel selecting switches 7a through 7e corresponding to a channel to be preset is turned-on. As a result, the write signal W is applied from the control circuit 10 to the random access read-write memory 9, so that the count output of the U/D counter 2, that is, a digital signal representative of the tuned frequency, can be memorized at an address which is assigned by the band selecting switch 8 of the read-write memory 9 and the channel selecting switch 7a through 7e that has been turned-on. Similarly as in the above described case, it is possible to preset desired frequencies for the other channels.

When carrying out the preset station selection, an address where a digital signal corresponding to a desired station is memorized is selected by selectively operating the band selecting switch 8 and the channel selecting switches 7a through 7e. In this case, since the preset switch 11 is normally in an "off" state, the load signal L is supplied from the control circuit 10 to the U/D counter 2. As a result, the read-write memory 9 reads, as an address, the outputs of the band selecting switch 8 and any one of the channel selecting switches 7a through 7e which is turned on. The stored signal of the read-write memory 9 is inputted, in parallel mode, into the U/D counter 2. The output of the U/D counter 2 is applied to the pulse synthesizer 4, whereafter the station selecting operation identical to that in the manual operation is carried out. Thereafter, the preset station selection in the same band can be changed merely by selectively turning on the channel selecting switches 7a through 7e. In addition, in the case where the band should be changed, the preset station selection is carried out by switching the band selecting switch 8 and then selectively turning on the channel selecting switches 7a through 7e.

In this case, if the preset station selection is carried out by operating the channel selecting switches 7a through 7e, the latch circuit 12 holds that output of the channel selecting switch (7a through 7e) which has been most recently operated to thereby continuously deliver that output to the input terminal D of the corresponding flip-flop circuit 13a–13e. If, under this condition, the load signal L is provided by the control circuit 10 and the read signal of the read-write memory 9 is inputted to the U/D counter 2, as a result of which the preset station selection is effected, then the load signal L is applied to the clock input terminals CK of the flip-flop circuits 13a through 13e. As a result, only the flip-flop circuit (13a through 13e) to which the latch output of the latch circuit 12 has been applied is set. Accordingly, only the display element (14a through 14e) connected to the flip-flop circuit (13a through 13e) which is in the set state, is lit by "H" signal provided at the set output terminal Q thereof. The display elements 14a through 14e are disposed near the channel selecting switches 7a through 7e, respectively, or are made integral with the associated channel selecting switches 7a through 7e, respectively, as was described before. Therefore, it can be determined from the display element (14a through 14e) thus lit which channel switch has been operated, or which channel stores the station being received.

When the manual station selection is effected by operating the pulse generator 1, the up-down pulse U/D provided during the manual operation is applied from the pulse genrator 1 to the one shot circuit 15, where a reset pulse having a narrow pulse width is produced in synchronization with the rise of the up-down pulse U/D. The reset pulse thus produced is applied to the flip-flop circuits 13a through 13e, as a result of which all of the flip-flop circuits 13a through 13e are reset and all of the display elements 14a through 14e are therefore turned off, which indicates that the preset station selection has not been effected.

Next, if the band selecting switch 8 is switched, the control circuit 10 is operated to provide another load signal, as a result of which the preset station selection state is obtained. In this case, the read-write memory 9 also holds the output of the most recently operated channel selecting switch. Therefore, in the electronic preset tuning system, the preset station selection in which the channel is the same but the band is different, is carried out. On the other hand, under this condition the output of the channel selecting switch which has been most recently operated is continuously latched by the latch circuit 12, and this latch output coincides with the hold information of the read-write memory 9. If, under this condition, the negative load signal L is outputted by the control circuit 10 in association with the switching operation of the band selecting switch, then a station stored in a position where the channel is the same but the band is different is received, similarly as in the above described case. Furthermore, upon provision of the load signal L, the flip-flop (13a through 13e) corresponding to the output latched in the latch circuit 12 is set. As a result, the display element (14a through 14e) connected to the set output terminal Q of the flip-flop circuit thus set is turned on, and then the channel selecting switch corresponding to the station being received is indicated. The indication in this case is the same channel indication as that in the above described case.

In the above described embodiment, the channel is light-indicated by the display elements provided respectively for the channel selecting switches; however, if the output of the latch circuit is supplied through a segment decoder to a digital display element, the channel can be digitally indicated.

As is apparent from the above description, in the station selection indicating device of the electronic preset tuning system according to the present invention, the latch circuit for latching the latest of the outputs of the channel selecting switches is provided, and when the latch output of the latch circuit coincides with the control signal for preset station selection, the display element provided near the corresponding channel selecting switch is lit, and in addition the light of the display element is put out by the pulse generated in association with the manual operation. Accordingly, it can be readily determined in what preset channel the station is being received. Therefore, a significant advantage of the present invention is that an erroneous preset operation can be prevented.

What is claimed is:

1. A multiband radio receiver with an electronic preset tuning system having an up-down counter, a read-write memory which is addressed by the output signals from a band select switch and channel select switches to store the count output of said up-down counter and to deliver read-out information to said up-down counter in response to write and load signals, respectively, and a control section for providing said write and load signals in response to the outputs of a preset switch and said channel select switches and band select switch, the improvement characterized in that said multiband radio receiver further includes a display section for indicating the most recently energized channel select switch, said display section comprising:

a latch circuit having a plurality of input terminals and a plurality of corresponding output terminals, said latch circuit receiving output signals from said channel select switches as its inputs and providing a latch output signal on the output terminal corresponding to the most recently energized channel select switch; and a plurality of indicating elements disposed adjacent said channel select switches and connected to said latch output terminals, said indicating elements being energized by the output signal from said latch circuit and said load signal so that the indicating element adjacent the most recently energized channel select switch is energized and remains energized even when the band select switch is switched.

2. A multiband radio receiver as defined in claim 1, wherein said display section further comprises a plurality of flip-flops receiving said load signal as a clock signal and each receiving one of said latch outputs as an input signal, each flip-flop providing said latch output signal to a respective indicating element upon receiving both said load signal and said latch output signal.

3. A multiband radio receiver as defined in claim 1, wherein the portion of the address supplied to said read-write memory by said channel select switches is stored in said memory so that new read-out information is automatically supplied to said up-down counter when said band select switch is switched without the necessity of providing an additional output signal from said channel select switches, the latch circuit continuing to energize the indicating element adjacent the most recently energized channel select switch even after switching of the band select switch so that the channel select switch corresponding to the presently tuned channel will continue to be indicated after the band has been changed.

* * * * *